USO11262060B2

(12) United States Patent
Tsai et al.

(10) Patent No.: US 11,262,060 B2
(45) Date of Patent: Mar. 1, 2022

(54) LIGHT SOURCE DEVICE

(71) Applicants: LITE-ON OPTO TECHNOLOGY (CHANGZHOU) CO., LTD., Jiangsu (CN); LITE-ON TECHNOLOGY CORPORATION, Taipei (TW)

(72) Inventors: Hsin-Wei Tsai, Kaohsiung (TW); I-Ju Chen, Taichung (TW); Hou-Yen Tsao, New Taipei (TW); Shu-Hua Yang, Taichung (TW); Yu-Hung Su, Taipei (TW)

(73) Assignees: LITE-ON OPTO TECHNOLOGY (CHANGZHOU) CO., LTD., Changzhou (CN); LITE-ON TECHNOLOGY CORPORATION, Taipei (TW)

( * ) Notice: Subject to any disclaimer, the term of this patent is extended or adjusted under 35 U.S.C. 154(b) by 453 days.

(21) Appl. No.: 16/535,425

(22) Filed: Aug. 8, 2019

(65) Prior Publication Data
US 2020/0051965 A1 Feb. 13, 2020

Related U.S. Application Data

(60) Provisional application No. 62/715,817, filed on Aug. 8, 2018.

(30) Foreign Application Priority Data

Sep. 27, 2018 (CN) .......................... 201821589077.7

(51) Int. Cl.
*H01L 25/16* (2006.01)
*H01L 25/075* (2006.01)
(Continued)

(52) U.S. Cl.
CPC .............. *F21V 23/06* (2013.01); *F21V 25/02* (2013.01); *G01S 17/08* (2013.01); *G01S 17/89* (2013.01); *H01L 24/48* (2013.01); *H01L 24/49* (2013.01); *H01L 25/0753* (2013.01); *H01L 25/167* (2013.01); *H01L 31/12* (2013.01);
(Continued)

(58) Field of Classification Search
None
See application file for complete search history.

(56) References Cited

U.S. PATENT DOCUMENTS

| 9,748,454 | B2* | 8/2017 | Lin | ..................... H01L 33/642 |
| 10,816,176 | B1* | 10/2020 | Lee | ..................... H01L 33/486 |
| 2020/0354934 | A1* | 11/2020 | Sonoda | ..................... E03C 1/182 |

* cited by examiner

*Primary Examiner* — Robert K Carpenter
(74) *Attorney, Agent, or Firm* — Li & Cai Intellectual Property (USA) Office

(57) ABSTRACT

A light source device includes a substrate, an electrode layer and an annular step-like surrounding frame both disposed on the substrate, a light emitter and a light detector both spaced apart from each other and mounted on the electrode layer in the surrounding frame, and a light permeable member disposed on the surrounding frame. The surrounding frame includes an upper tread arranged away from the substrate, an upper riser connected to an inner edge of the upper tread, a lower tread arranged at an inner side of the upper riser, and a lower riser connected to an inner edge of the lower tread and arranged away from the upper tread. The surrounding frame has a notch recessed in the lower tread and the lower riser for spatially communicating an inner side of the surrounding frame to an external space.

17 Claims, 15 Drawing Sheets

(51) Int. Cl.
    *H01L 33/48*      (2010.01)
    *H01L 33/62*      (2010.01)
    *H01L 33/54*      (2010.01)
    *H01L 23/00*      (2006.01)
    *F21V 23/06*      (2006.01)
    *H01L 31/12*      (2006.01)
    *F21V 25/02*      (2006.01)
    *H01S 5/042*      (2006.01)
    *G01S 17/08*      (2006.01)
    *G01S 17/89*      (2020.01)
    *H01S 5/02216*    (2021.01)
    *F21Y 115/30*     (2016.01)
    *F21Y 115/10*     (2016.01)

(52) U.S. Cl.
    CPC ............ *H01L 33/486* (2013.01); *H01L 33/54* (2013.01); *H01S 5/02216* (2013.01); *H01S 5/0425* (2013.01); *F21Y 2115/10* (2016.08); *F21Y 2115/30* (2016.08); *H01L 33/62* (2013.01); *H01L 2224/48091* (2013.01); *H01L 2224/48137* (2013.01); *H01L 2224/48247* (2013.01); *H01L 2224/49109* (2013.01)

LIGHT SOURCE DEVICE

CROSS-REFERENCE TO RELATED PATENT APPLICATION

This application claims the benefit of priority to China Patent Application No. 201821589077.7, filed on Sep. 27, 2018 in People's Republic of China. The entire content of the above identified application is incorporated herein by reference.

This application claims priority from U.S. Provisional Patent Application Ser. No. 62/715,817 filed on Aug. 8, 2018, which application is incorporated herein by reference in its entirely.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a light source device, and more particularly to a light source device having at least one air channel.

BACKGROUND OF THE DISCLOSURE

A conventional laser light source device mostly uses a TO-CAN package, and has not undergone much structural improvement in recent years, so that it has gradually become difficult for the conventional laser light source device to meet various requirements. For example, the conventional laser light source device is difficult to be applied to an infrared light source used in three-dimensional sensing.

SUMMARY OF THE DISCLOSURE

In response to the above-referenced technical inadequacies, the present disclosure provides a light source device to effectively improve the issues associated with conventional light source devices (e.g., the size of the conventional light source device is too large, and cannot be used to carry a high-power light source).

In one aspect, the present disclosure provides a light source device, which includes a substrate, an electrode layer, a surrounding frame, a light emitter, a light detector, and a light permeable member. The substrate includes a first surface and a second surface opposite to the first surface. The electrode layer is disposed on the first surface of the substrate. The surrounding frame is disposed on the first surface and is formed in an annular step-like structure. The surrounding frame includes an upper tread, an upper riser, a lower tread, and a lower riser. The upper tread is arranged away from the substrate. The upper riser is connected to an inner edge of the upper tread. The lower tread is arranged at an inner side of the upper riser, and a distance between the lower tread and the first surface is less than a distance between the upper tread and the first surface. The lower riser is connected to an inner edge of the lower tread and is arranged away from the upper tread. The lower riser and the first surface jointly surround to form an accommodating space, and the surrounding frame has at least one notch recessed in the lower tread and the lower riser and being in spatial communication with the accommodating space. The light emitter and the light detector are spaced apart from each other and are mounted on the electrode layer. The light emitter and the light detector are arranged in the accommodating space. The light permeable member is disposed on the lower tread of the surrounding frame and is spaced apart from the upper riser, so that the at least one notch is formed as at least one air channel in spatial communication with the accommodating space and an external space.

In one aspect, the present disclosure provides a light source device, which includes a substrate, an electrode layer, a surrounding frame, a light emitter, and a light permeable member. The substrate includes a first surface and a second surface opposite to the first surface. The electrode layer is disposed on the first surface of the substrate. The surrounding frame is disposed on the first surface and is formed in an annular step-like structure. The surrounding frame includes an upper tread, an upper riser, a lower tread, and a lower riser. The upper tread is arranged away from the substrate. The upper riser is connected to an inner edge of the upper tread. The lower tread is arranged at an inner side of the upper riser, and a distance between the lower tread and the first surface is less than a distance between the upper tread and the first surface. The lower riser is connected to an inner edge of the lower tread and is arranged away from the upper tread. The lower riser and the first surface jointly surround to form an accommodating space, and the surrounding frame has at least one notch recessed in the lower tread and the lower riser and being in spatial communication with the accommodating space. The light emitter is mounted on the electrode layer and is arranged in the accommodating space. The light permeable member is disposed on the lower tread of the surrounding frame and is spaced apart from the upper riser, so that the at least one notch is formed as at least one air channel in spatial communication with the accommodating space and an external space.

Therefore, since the surrounding frame of the light source device of the present disclosure is formed with a specific structure, the accommodating space arranged in the surrounding frame is in spatial communication with an external space through the notch, thereby providing a new package structure to simplify manufacturing process and to increase product reliability.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
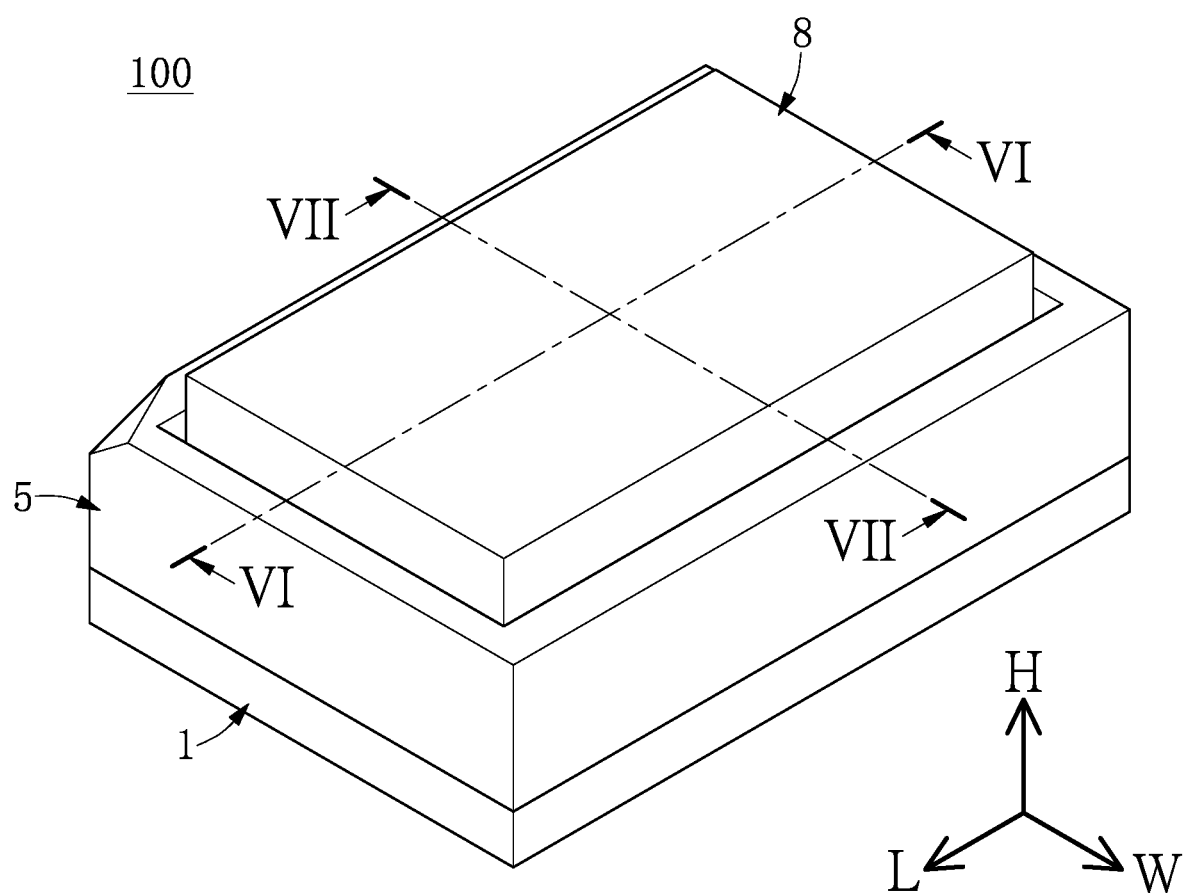
FIG. 1 is a perspective view of a light source device according to a first embodiment of the present disclosure.
Figure 2:
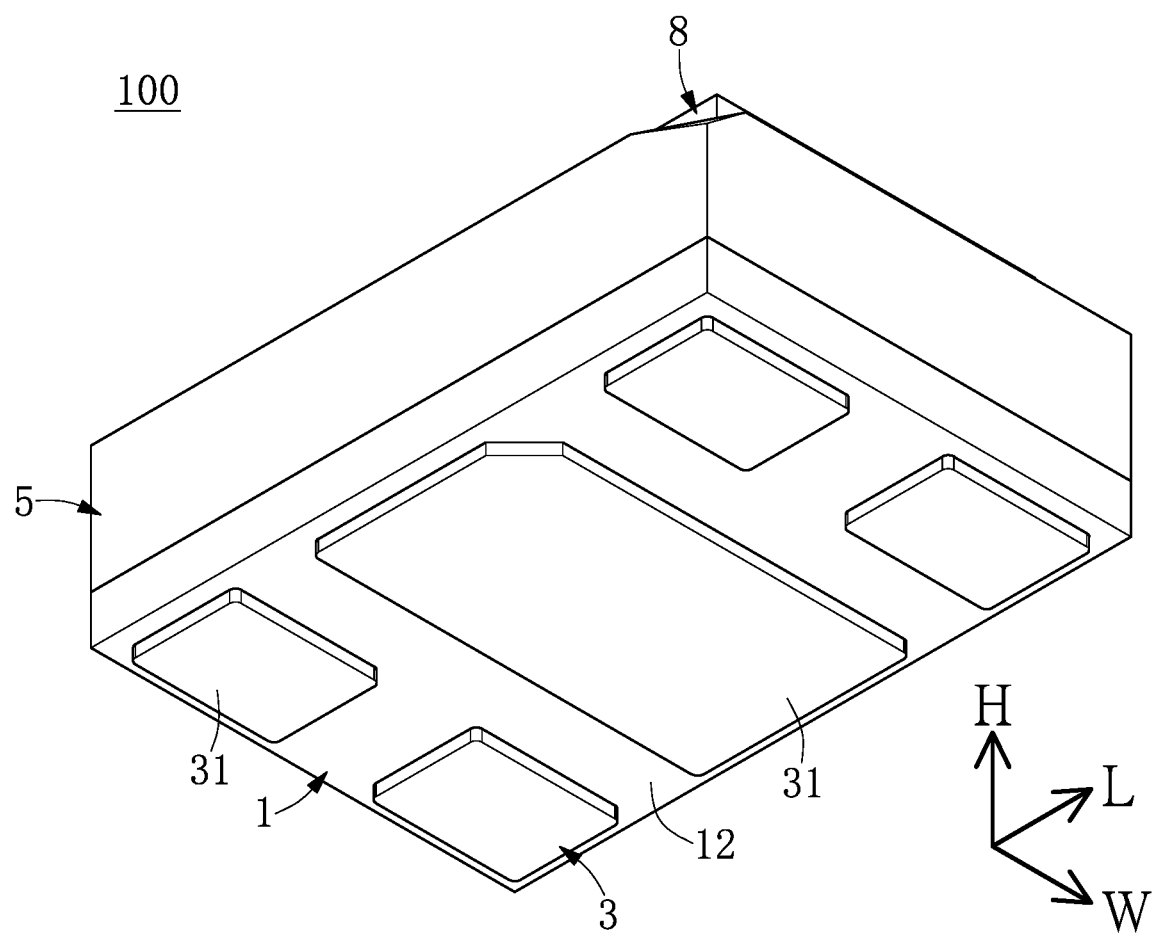
FIG. 2 is a perspective view of the light source device from another view angle.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Referring to FIG. 1 to FIG. 15, embodiments of the present disclosure each provide a light source device 100. The light source device 100 is applied to three-dimensional sensing, and more particularly to time-of-flight depth camera, but the present disclosure is not limited thereto. As shown in FIG. 1 to FIG. 7, the light source device 100 includes a substrate 1, an electrode layer 2 and a soldering layer 3 both disposed on two opposite sides of the substrate 1, a plurality of conductive posts 4 embedded in the substrate 1, a surrounding frame 5 disposed on the substrate 1, a light emitter 6 and a light detector 7 both spaced apart from each other and mounted on the electrode layer 2, a light permeable member 8 disposed on the surrounding frame 5, and an adhesive 9 fixing the light permeable member 8 onto the surrounding frame 5. The following description describes the structure and connection of each component of the light source device 100.

Figure 5:
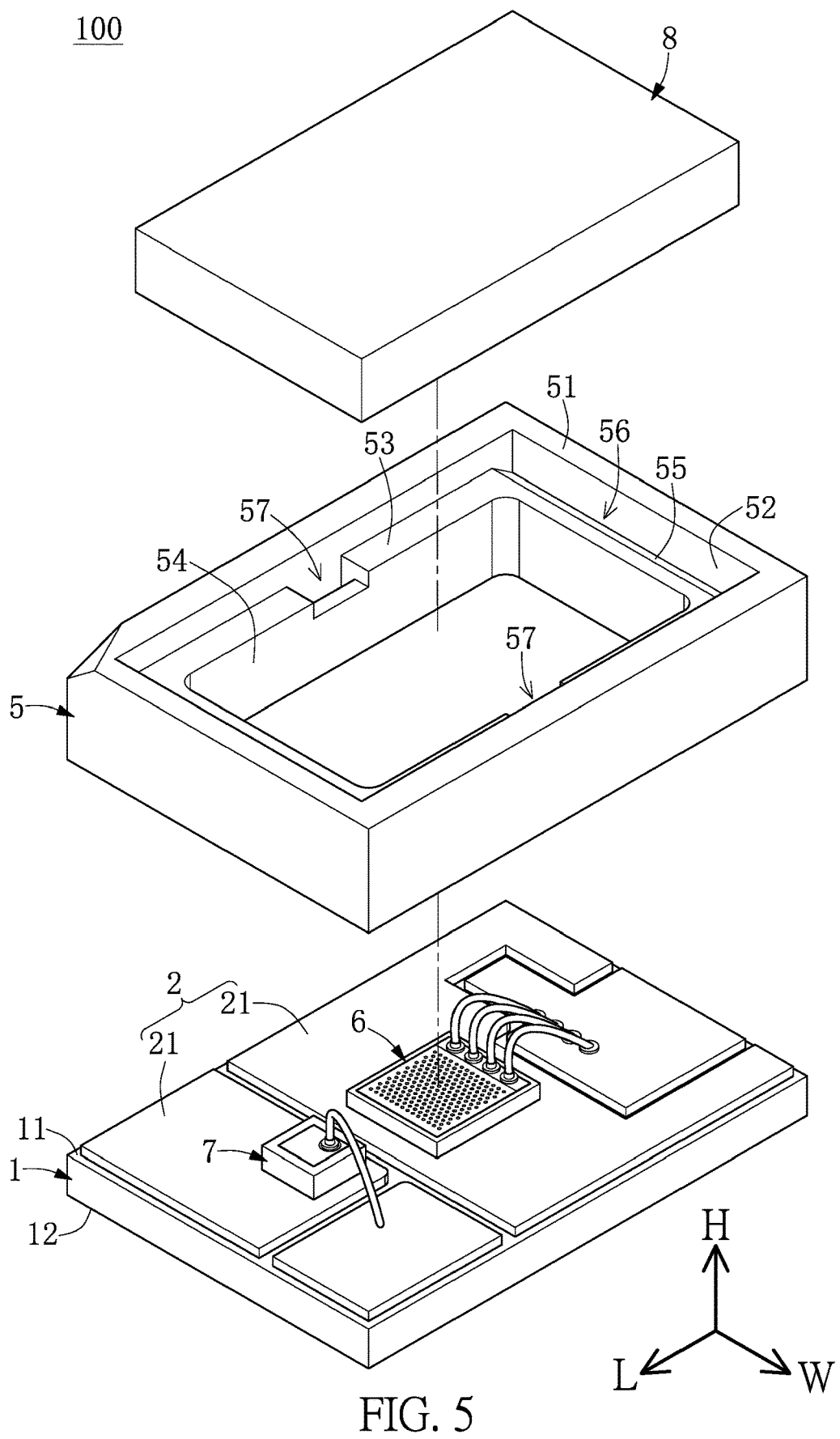
FIG. 5 is an exploded view of FIG. 3 with the adhesive omitted.
Figure 6:
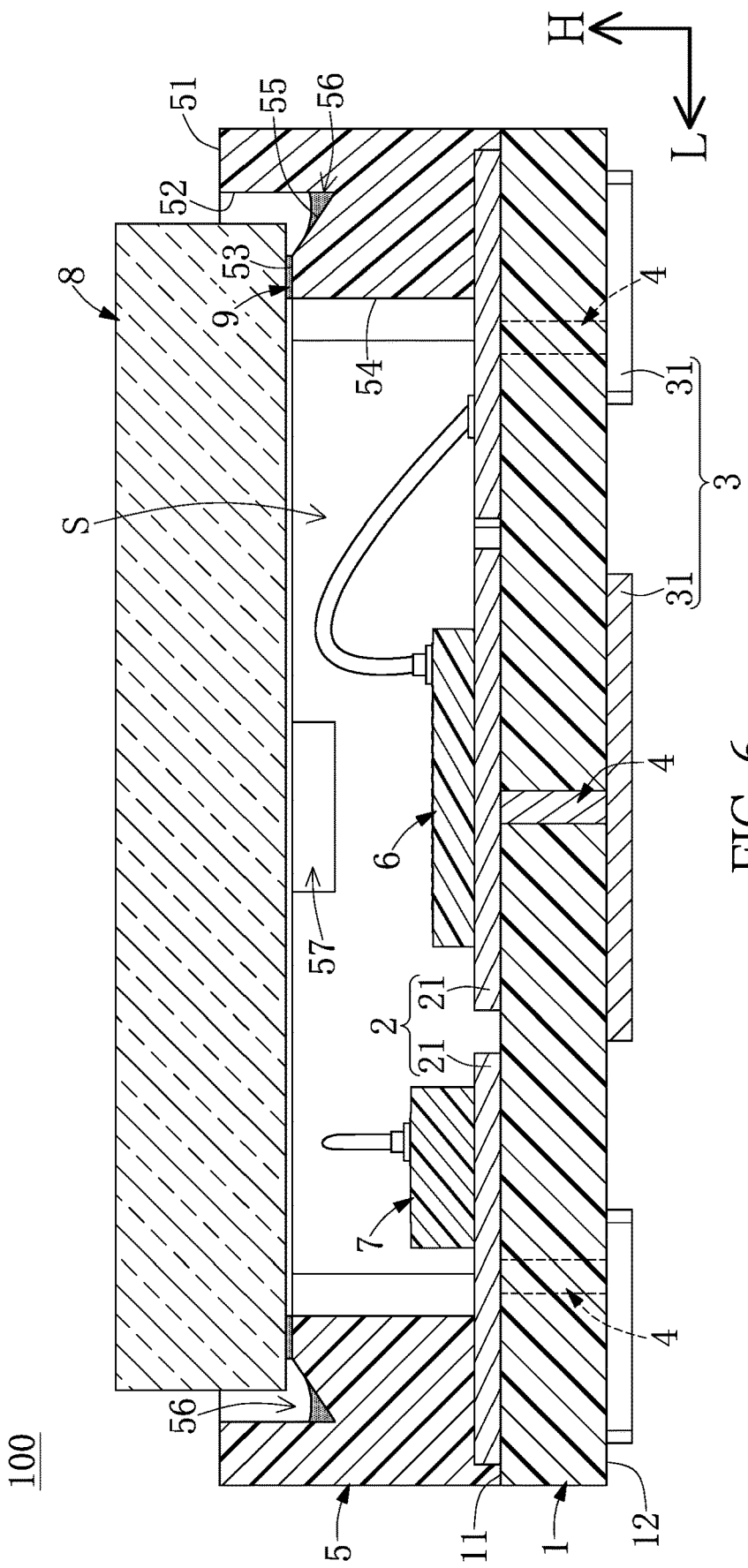
FIG. 6 is a cross-sectional view taken along a cross-section line VI-VI of FIG. 1.
Figure 7:
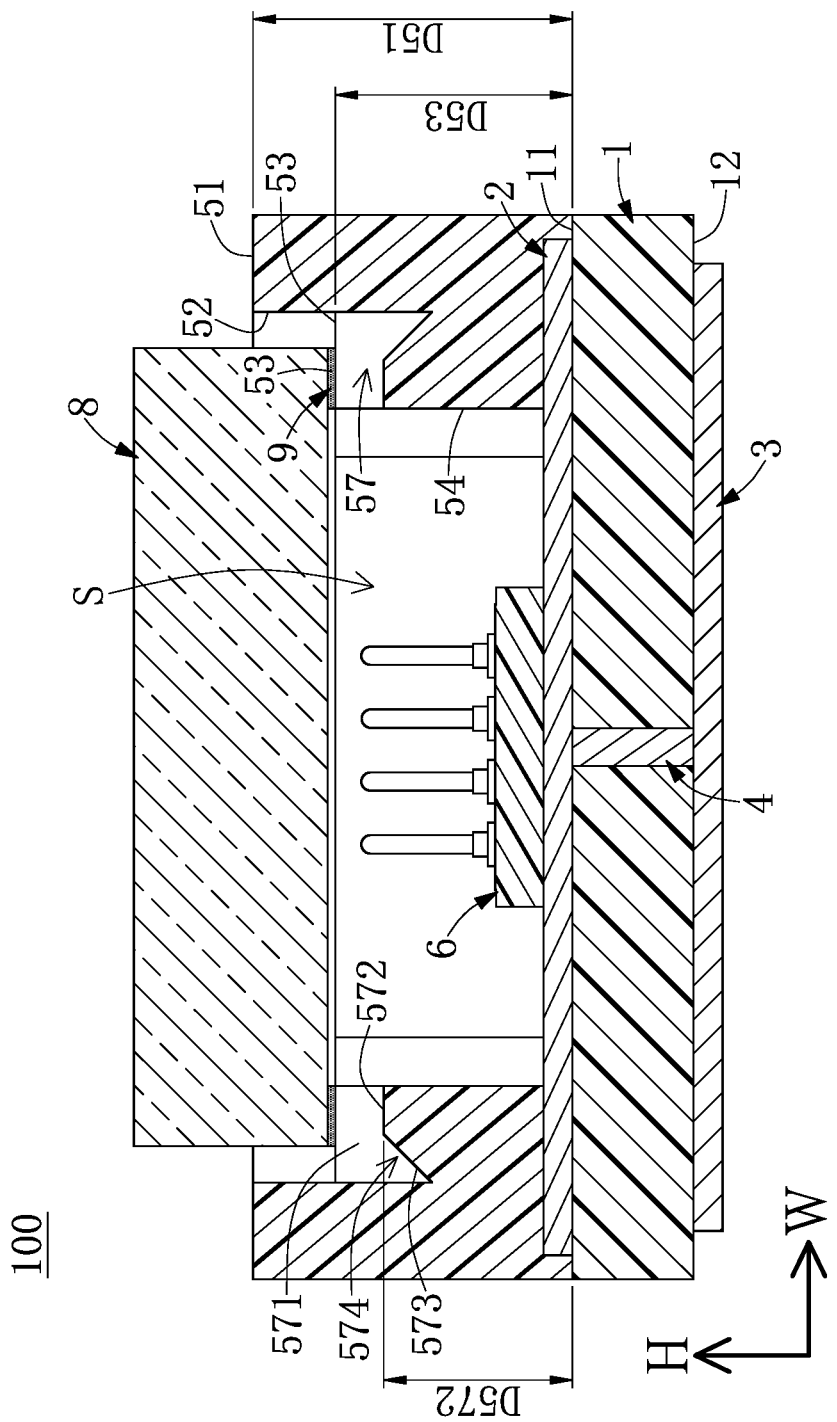
FIG. 7 is a cross-sectional view taken along a cross-section line VII-VII of FIG. 1.
Figure 8:
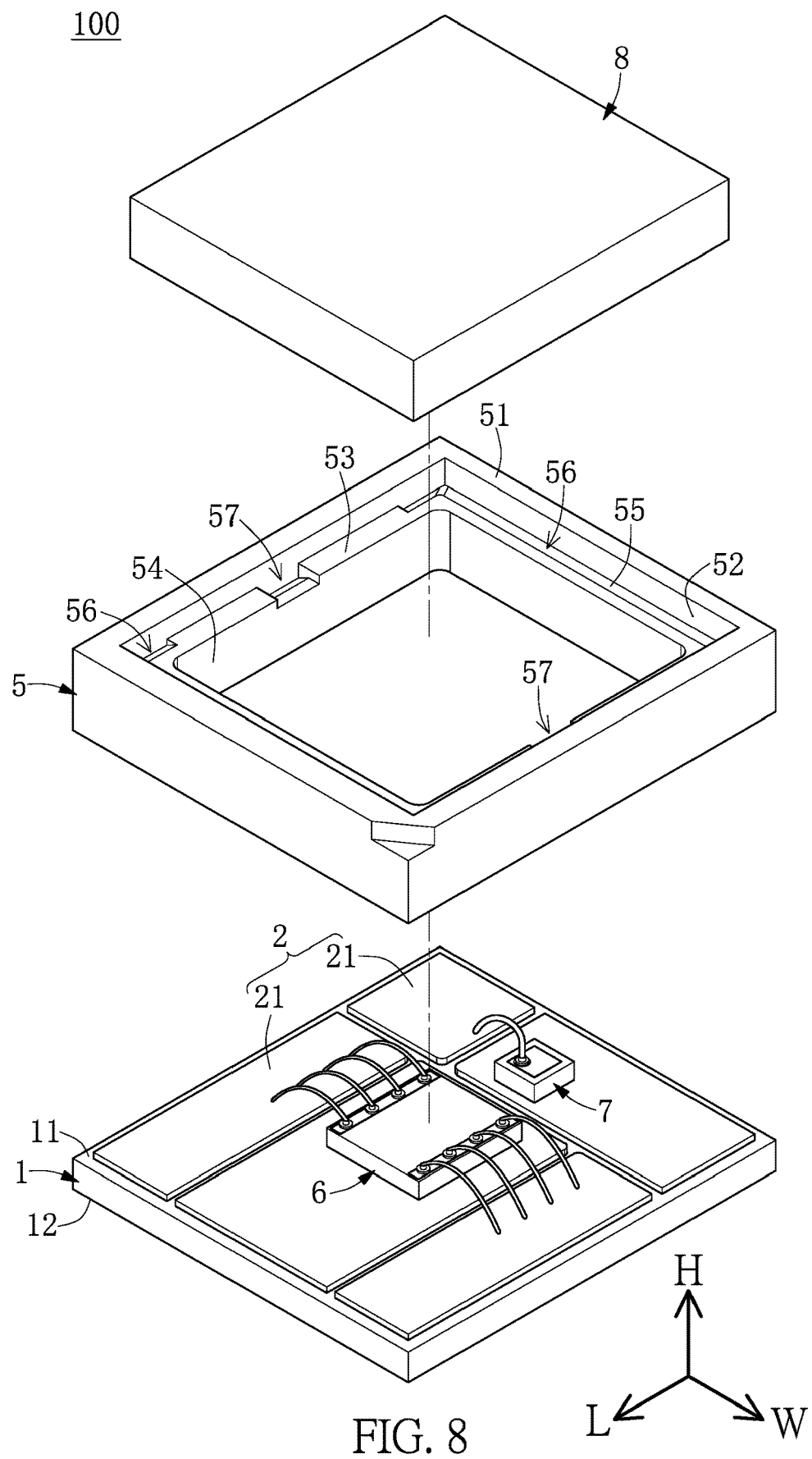
FIG. 8 is an exploded view of a light source device with an adhesive omitted according to a second embodiment of the present disclosure.
Figure 9:
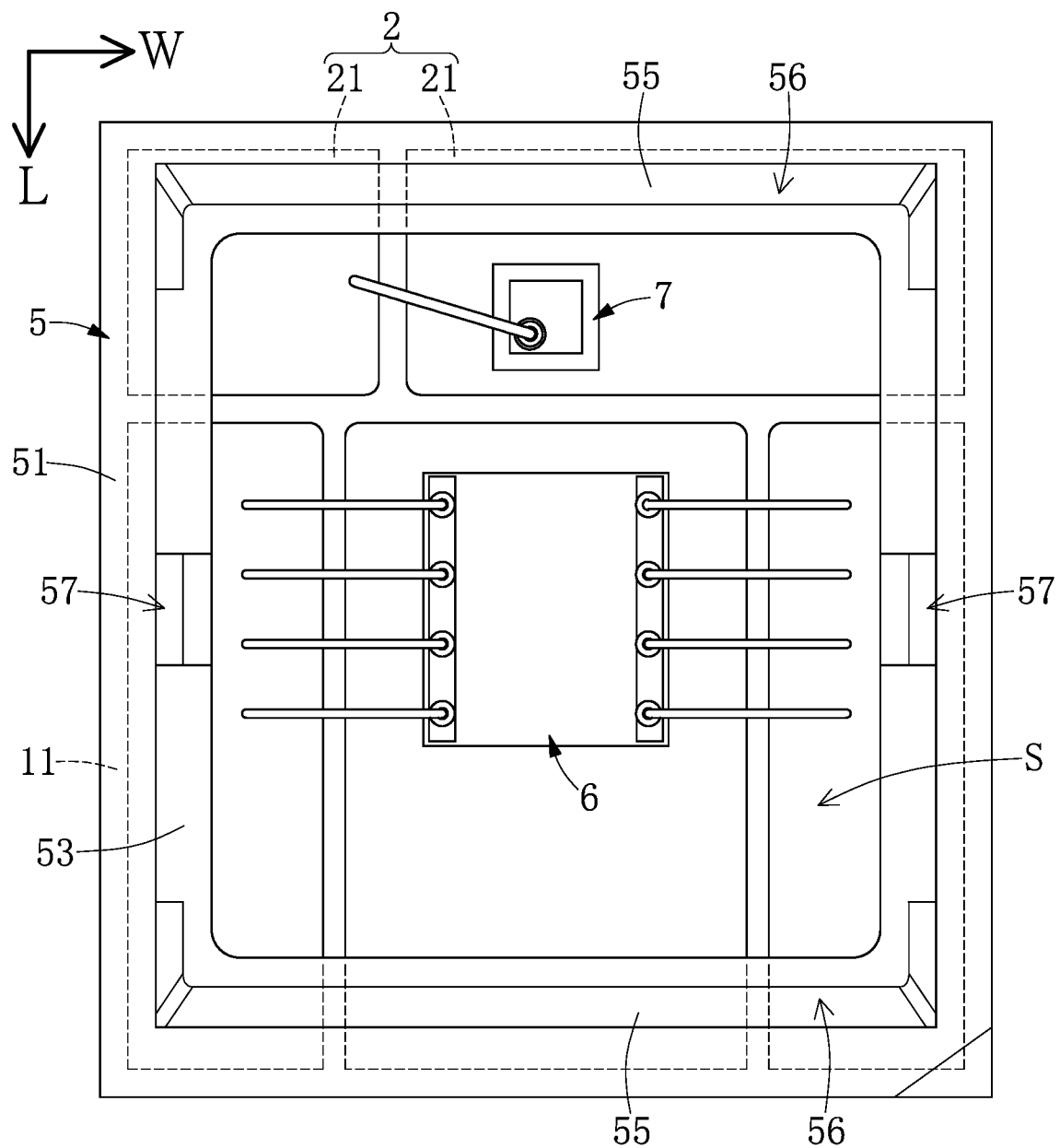
FIG. 9 is a top view of FIG. 8 with the adhesive and a light permeable member omitted.
Figure 10:
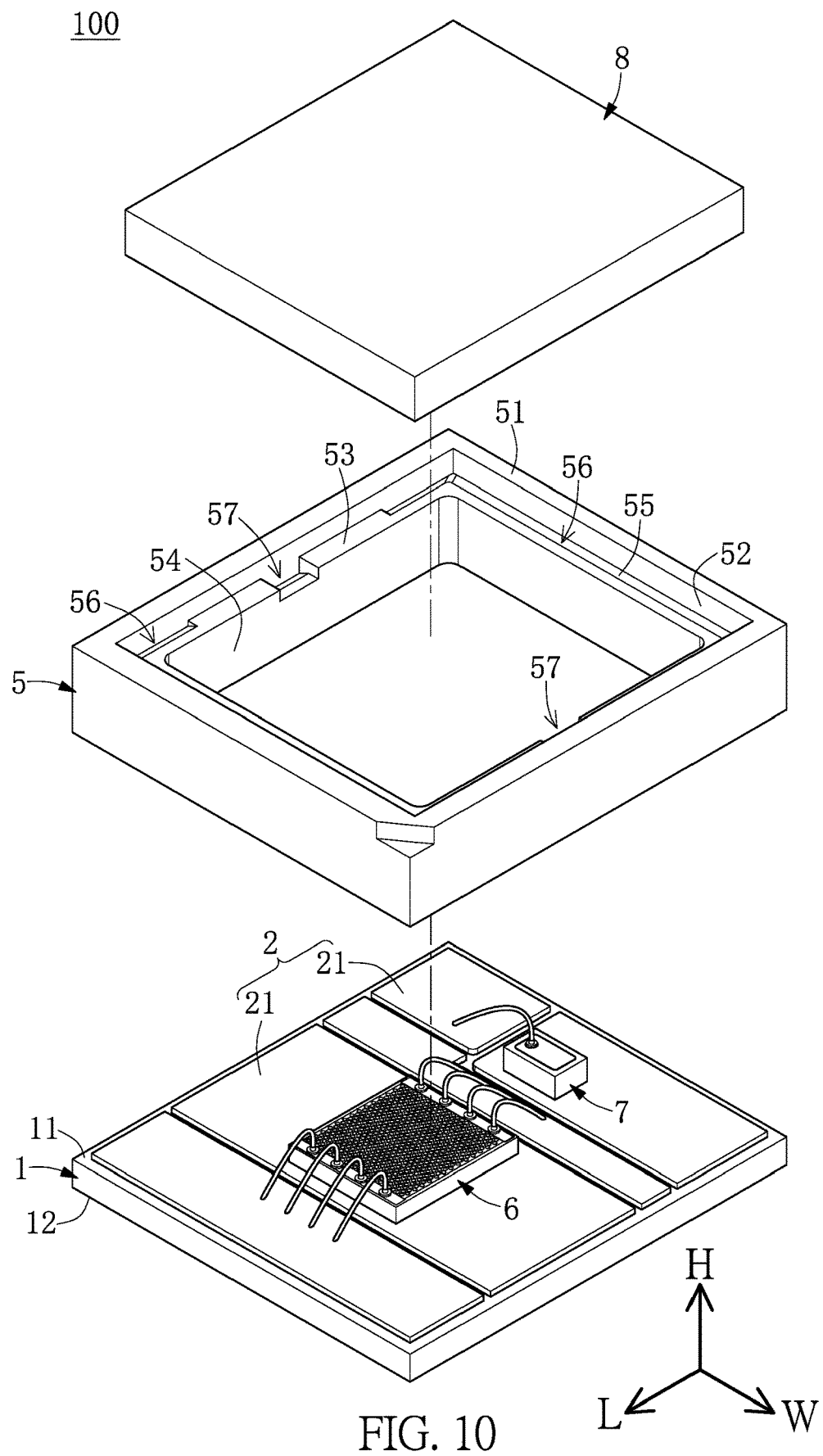
FIG. 10 is an exploded view of a light source device with an adhesive omitted according to a third embodiment of the present disclosure.
Figure 11:
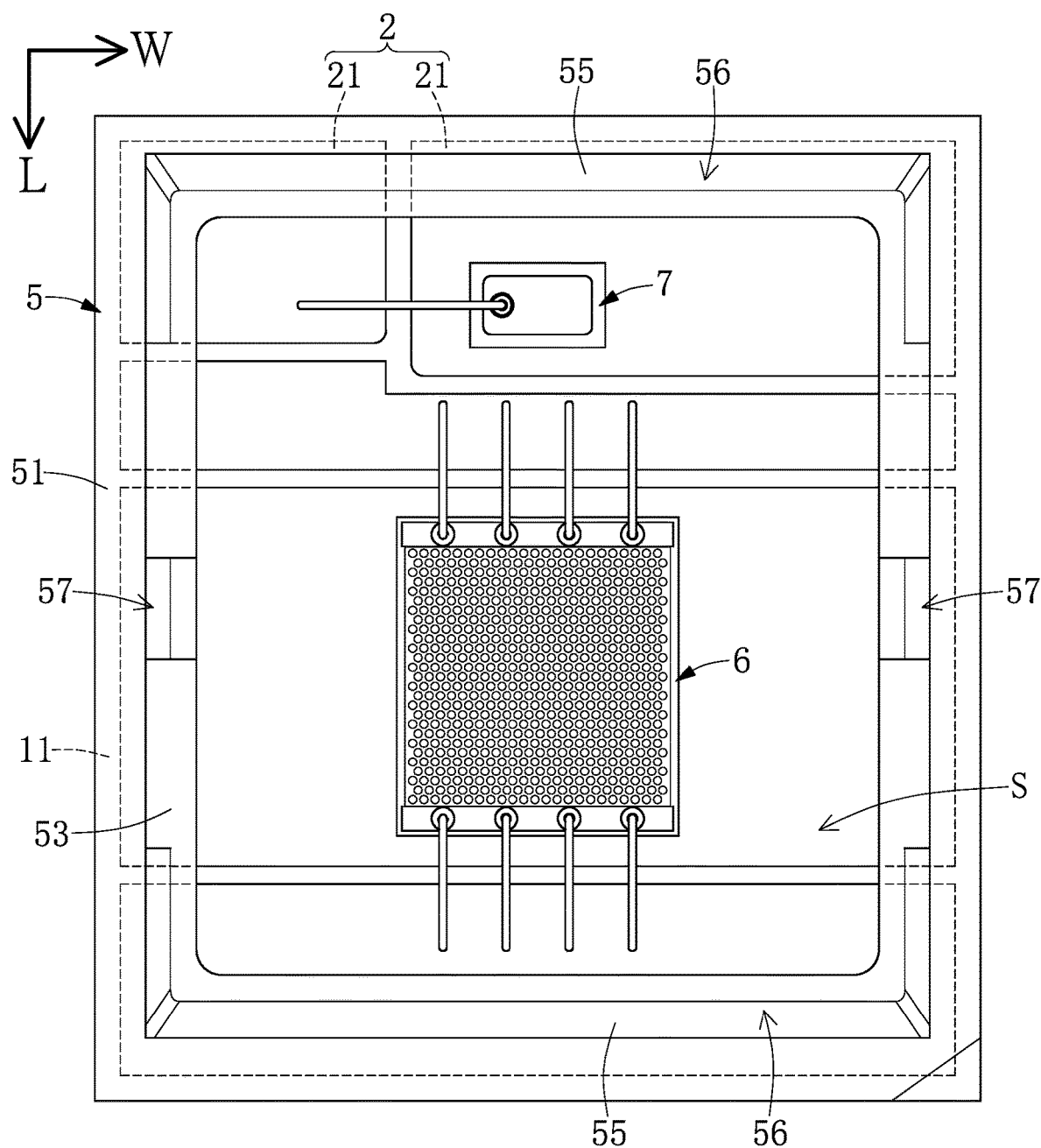
FIG. 11 is a top view of FIG. 10 with the adhesive and a light permeable member omitted.

As shown in FIG. 5 to FIG. 7, the substrate 1 in the present embodiment is substantially in a rectangular shape or a square shape and defines a longitudinal direction L, a width direction W, and a height direction H, which are orthogonal to each other, for presenting the relative position of the components of the light source device 100. The substrate 1 of the present embodiment is an insulating substrate, such as a printed circuit board or a ceramic board, and includes a first surface 11 and a second surface 12 opposite to the first surface 11.

Figure 4:
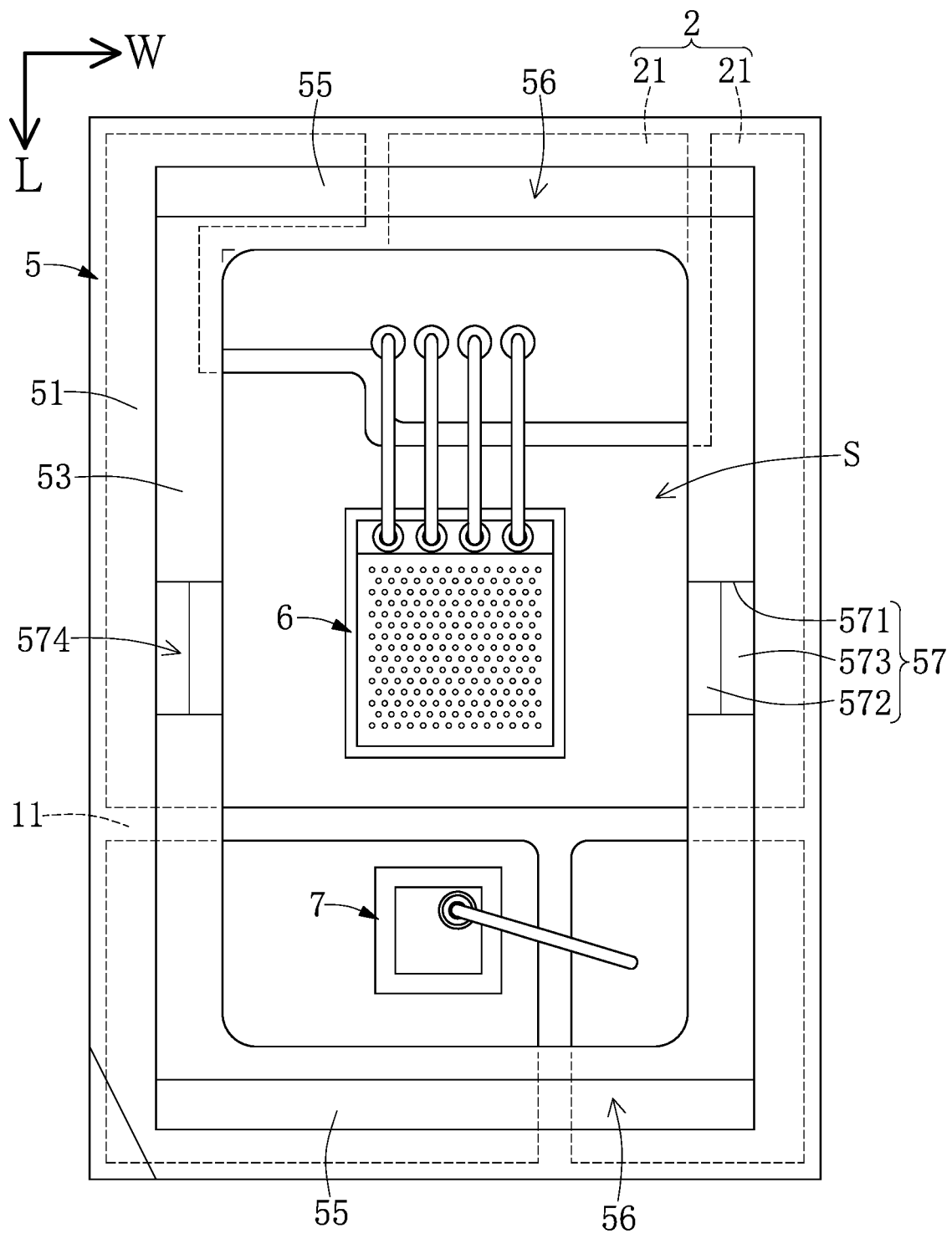
FIG. 4 is a top view of FIG. 1 with the adhesive and a light permeable member omitted.

The electrode layer 2 is disposed on the first surface 11 of the substrate 1, and includes a plurality of electrode pads 21 spaced apart from each other. The electrode pads 21 preferably correspond in geometrical shape to each other, thereby covering at least 80% of an area of the first surface 11. However, the shape of each of the electrode pads 21 can be adjusted or changed according to design requirements, and is not limited to the drawings. As shown in FIG. 4, the electrode layer 2 includes four electrode pads 21, two of the four electrode pads 21 are provided for die-bonding and wiring of the light detector 7, and the other two of the four electrode pads 21 are provided for die-bonding and wiring of the light emitter 6.

The soldering layer 3 is disposed on the second surface 12 of the substrate 1 and includes a plurality soldering pads 31 spaced apart from each other. Moreover, each of the conductive posts 4 embedded in the substrate 1 has two ends respectively connected to the electrode layer 2 and the soldering layer 3, thereby establishing an electrical connection between the electrode layer 2 and the soldering layer 3. Specifically, a middle one of the soldering pads 31 is provided for heat-dissipating, and the other soldering pads 31 respectively arranged at two opposite sides of the middle soldering pad 31 are configured to be positive electrodes and negative electrodes of the light emitter 6 and the light detector 7. In other words, the four soldering pads 31 at the two opposite sides of the middle soldering pad 31 are respectively and electrically coupled to the four electrode pads 21 through the conductive posts 4.

As shown in FIG. 5 to FIG. 7, the surrounding frame 5 is disposed on the first surface 11 of the substrate 1, and outer lateral sides of the surrounding frame 5 are preferably flush with outer lateral sides of the substrate 1. A periphery portion of the electrode layer 2 (e.g., a portion of each of the electrode pads 21) is embedded in the surrounding frame 5. The surrounding frame 5 is formed in an annular step-like structure and is integrally formed as one-piece structure in the present embodiment, but the present disclosure is not limited thereto. For example, in other embodiments of the present disclosure, the surrounding frame 5 and the substrate 1 can be integrally formed as one-piece structure.

Specifically, the surrounding frame 5 sequentially includes an upper tread 51, an upper riser 52 connected to an inner edge of the upper tread 51, a lower tread 53, and a lower riser 54 connected to an inner edge of the lower tread 53. The upper tread 51, the upper riser 52, the lower tread 53, and the lower riser 54 are sequentially arranged from an outer side to an inner side of the surrounding frame 5.

Moreover, the surrounding frame 5 in the present embodiment includes two slanting surfaces 55 each connected to the upper riser 52 and the lower tread 53, and the two slanting surfaces 55 are respectively connected to two opposite edges of the lower tread 53 (e.g., two short edges of the lower tread 53 shown in FIG. 4 and FIG. 5). The surrounding frame 5 is made of polymer material or ceramic material.

The upper tread 51 is in a rectangular and annular shape or a square and annular shape, and is arranged away from the substrate 1. The upper tread 51 in the present embodiment is a top surface of the surrounding frame 5, and is preferably parallel to the first surface 11 of the substrate 1. The upper riser 52 is in a rectangular and annular shape or a square and annular shape, and is perpendicularly connected to the inner edge of the upper tread 51. The lower tread 53 is in a rectangular and annular shape or a square and annular shape, and is arranged at an inner side of the upper riser 52. The lower tread 53 is preferably parallel to the upper tread 51, and a distance D53 between the lower tread 53 and the first surface 11 is less than a distance D51 between the upper tread 51 and the first surface 11. The lower riser 54 is in a rectangular and annular shape or a square and annular shape. The lower riser 54 is perpendicularly connected to the inner edge of the lower tread 53, and is arranged away from the upper tread 51. The lower riser 54 and the first surface 11 of the substrate 1 jointly surround to form an accommodating space S.

Moreover, an edge of each of the two slanting surfaces 55 (e.g., an inner edge of each of the two slating surfaces 55 shown in FIG. 6) is connected to the lower tread 53 so as to jointly form a slanted angle more than 90 degrees, and another edge of each of the two slanting surfaces 55 (e.g., an outer edge of each of the two slating surfaces 55 shown in FIG. 6) is connected to the upper riser 52 so as to jointly form a receiving groove 56 having an angle less than 90 degrees. In other words, the two receiving grooves 56 are positioned to be opposite to each other along the longitudinal direction L, but the present disclosure is not limited thereto. For example, in other embodiments of the present disclosure, the surrounding frame 5 can be formed with at least one slanting surface 55 and at least one receiving groove 56 corresponding in position to the at least one slanting surface 55, or the surrounding frame 5 can be formed without any slanting surface 55 and any receiving groove 56.

As shown in FIG. 5 to FIG. 7, the surrounding frame 5 has two notches 57 each recessed in the lower tread 53 and the lower riser 54 and being in spatial communication with the accommodating space S. The two notches 57 are positioned to be opposite to each other along the width direction W. In the present embodiment, the two notches 57 are respectively located at centers of two long edges of the lower tread 53. That is to say, the two receiving grooves 56 and the two notches 57 of the surrounding frame 5 respectively correspond in position to four edges of the lower tread 53, but the present disclosure is not limited thereto. For example, in other embodiments of the present disclosure, the surrounding frame 5 can be formed with at least one notch 57.

Figure 3:
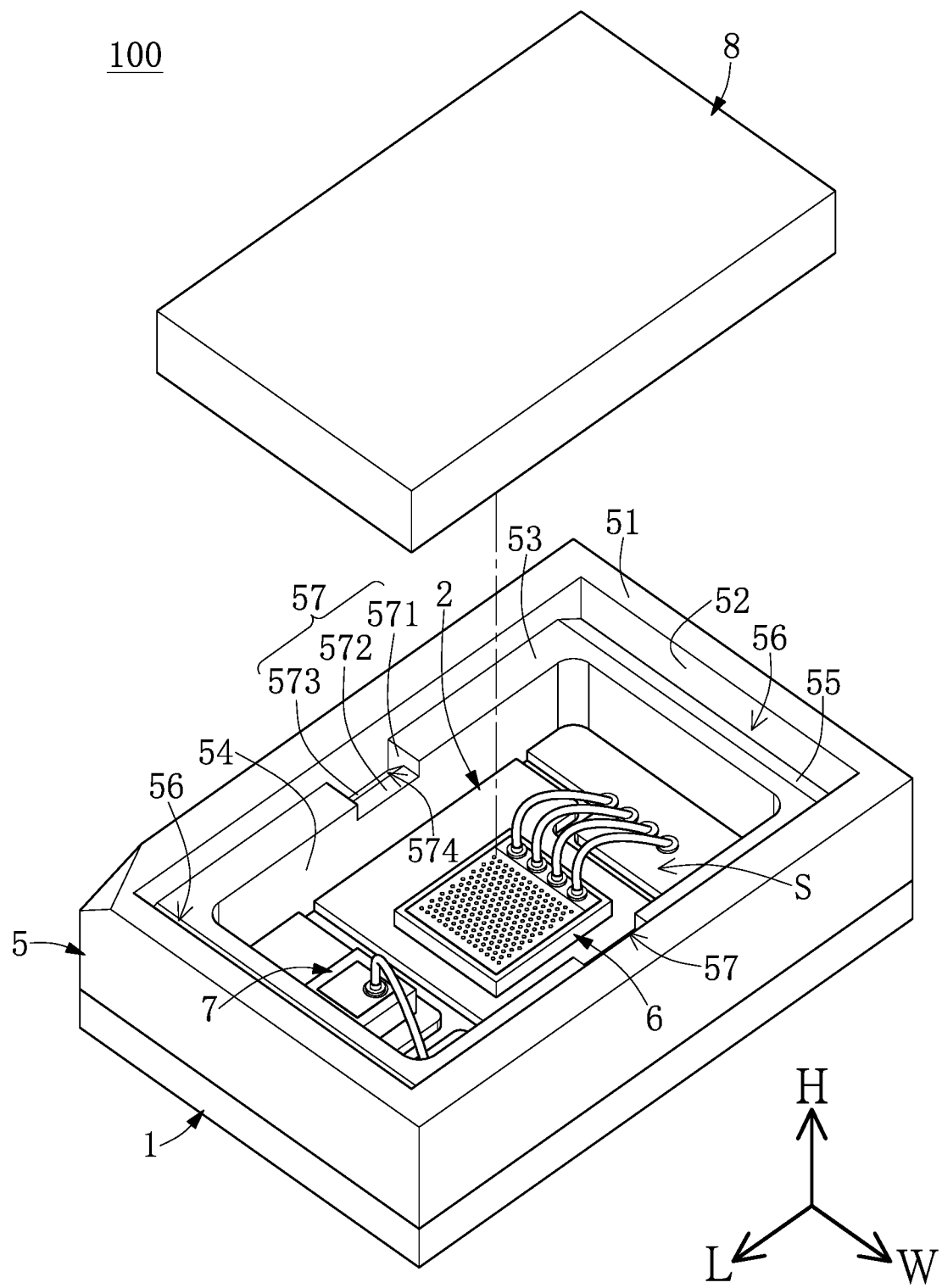
FIG. 3 is an exploded view of FIG. 1 with an adhesive omitted.

Specifically, as shown in FIG. 3, FIG. 4 and FIG. 7, each of the two notches 57 includes two inner walls 571 facing and spaced apart from each other and two bottom walls. The two bottom walls include (or are) a flat bottom wall 572 and a slanting bottom wall 573. The flat bottom wall 572 and the slanting bottom wall 573 are arranged between the two inner walls 571. In each of the two notches 57, each of the two inner walls 571 is perpendicularly connected to the upper tread 52, and a distance D572 between the flat bottom wall 572 and the first surface 11 is less than the distance D53 between the lower tread 53 and the first surface 11. Moreover, in each of the two notches 57, an edge of the slanting bottom wall 573 (e.g., an inner edge of the slanting bottom wall 573 shown in FIG. 7) is connected to the flat bottom wall 572 so as to jointly form an angle more than 90 degrees, and another edge of the slanting bottom wall 573 (e.g., an outer edge of the slanting bottom wall 573 shown in FIG. 7) is connected to the upper riser 52 so as to jointly form a slot 574 having an angle less than 90 degrees. The slot 574 is in a V-shape for receiving dust or particles, thereby preventing dust or particles from entering into the accommodating space S.

As shown in FIG. 5 to FIG. 7, the light emitter 6 in the present embodiment is at least one Vertical-Cavity Surface-Emitting Laser (VCSEL) for providing an infrared light, and the light detector 7 in the present embodiment is a photo-diode (PD), but the present disclosure is not limited thereto. The light emitter 6 also can be a VCSEL array or more than one VCSEL chip. The light detector 7 is configured to monitor light signal (e.g., laser light) emitted from the light emitter 6 so as to prevent the light signal from harming the eyes, thereby providing an eye protection function. For example, in other embodiments of the present disclosure, the light emitter 6 can be at least one LED chip. In addition, the present disclosure also provides a depth camera module (not shown) including the light source device 100, and the light emitter 6 and the light detector 7 of the light source device 100 are respectively limited to VCSEL and PD.

The light emitter 6 and the light detector 7 are arranged in the accommodating space S, the light emitter 6 is preferably disposed on a center portion of the first surface 11, and the light emitter 6 and the light detector 7 are preferably arranged along the longitudinal direction L.

Figure 14:
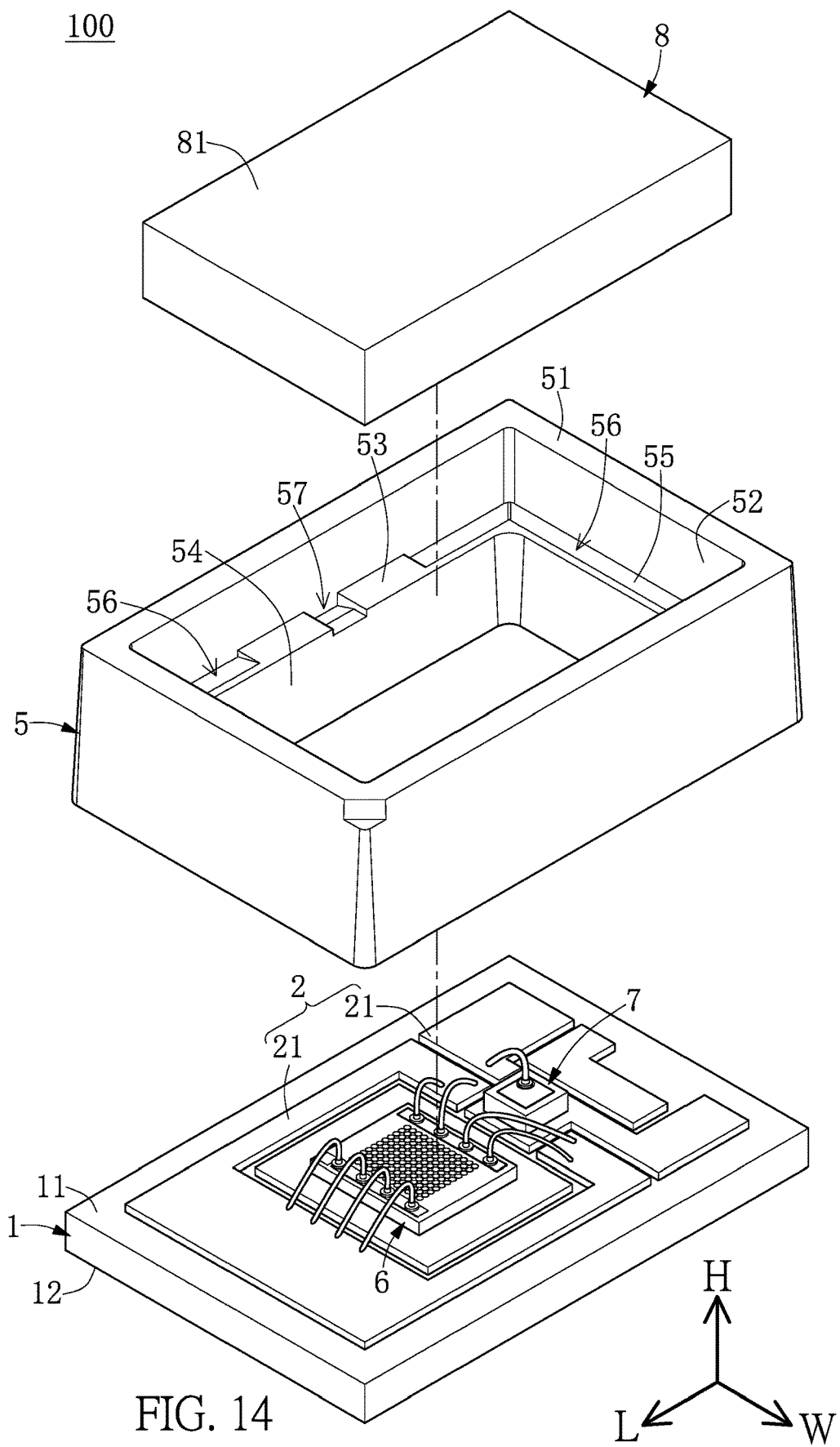
FIG. 14 is an exploded view of a light source device with an adhesive omitted according to a fifth embodiment of the present disclosure.

As shown in FIG. 5 to FIG. 7, the light permeable member 8 in the present embodiment includes a transparent glass board and a light-diffusion polymer layer formed on the transparent glass board. The light permeable member 8 is disposed on the lower tread 53 of the surrounding frame 5 and is spaced apart from the upper riser 52 (i.e., the light permeable member 8 does not contact the upper riser 52), so that each of the two notches 57 is formed as an air channel in spatial communication with the accommodating space S and an external space. Moreover, a protruding part of the light permeable member 8 protrudes from the upper tread 51 of the surrounding frame 5, and a volume of the protruding part of the light permeable member 8 is more than 50% of a total volume of the light permeable member 8, but the present disclosure is not limited thereto. For example, as shown in FIG. 14, the light permeable member 8 does not protrude from the upper tread 51 of the surrounding frame 5. In other words, a top surface 81 of the light permeable member 8 is coplanar with the upper thread 51 of the surrounding frame 5.

Moreover, the light permeable member 8 is fixed onto the lower tread 53 of the surrounding frame 5 through the adhesive 9, and the connection between the light permeable member 8 and the lower tread 53 can be gapless by the adhesive 9. Each of the two receiving grooves 56 of the surrounding frame 5 is configured to receive a part of the adhesive 9 (e.g., a part of the adhesive 9 overflowing from the light permeable member 8 and the lower tread 53).

Figure 12:
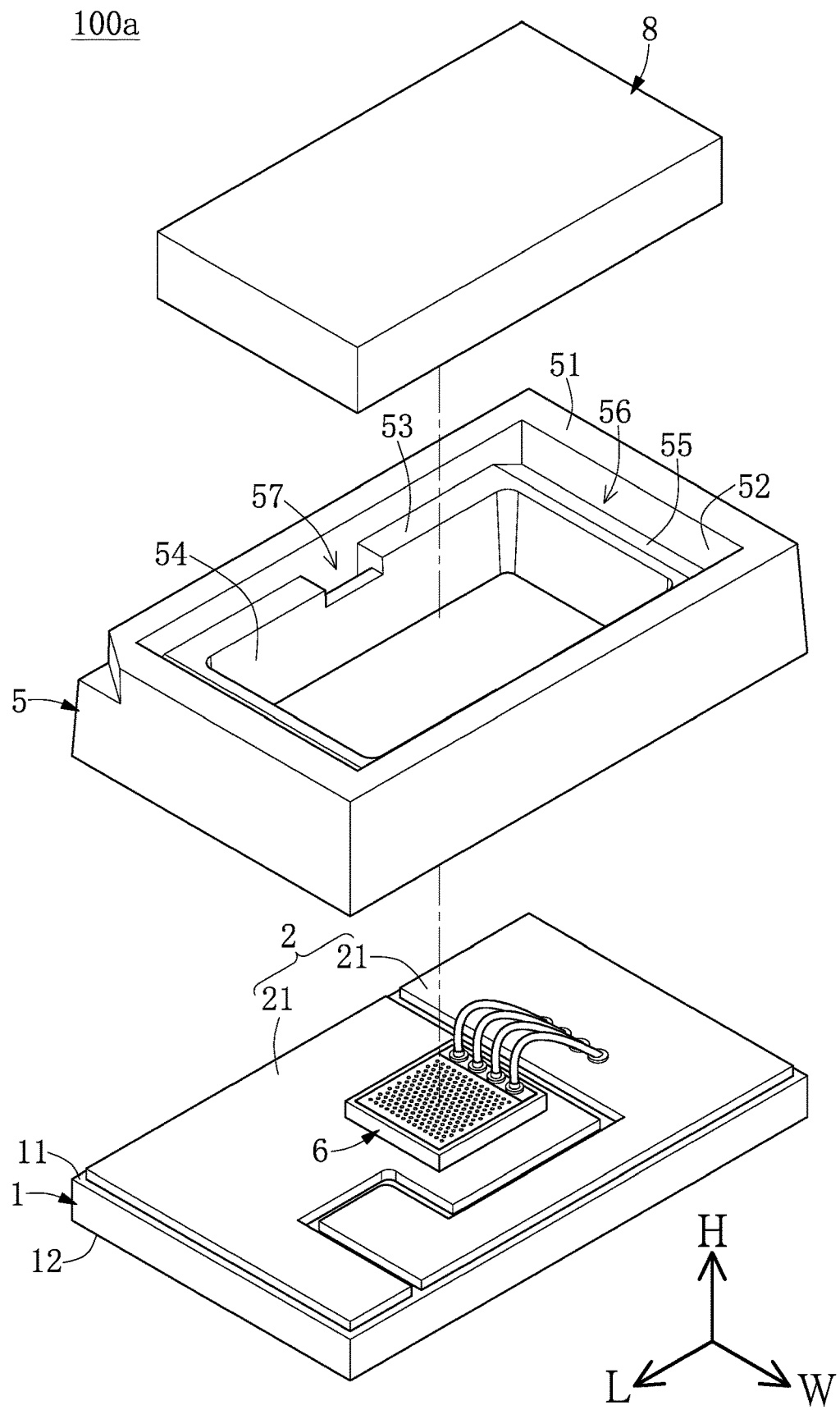
FIG. 12 is an exploded view of a light source device with an adhesive omitted according to a fourth embodiment of the present disclosure.
Figure 13:
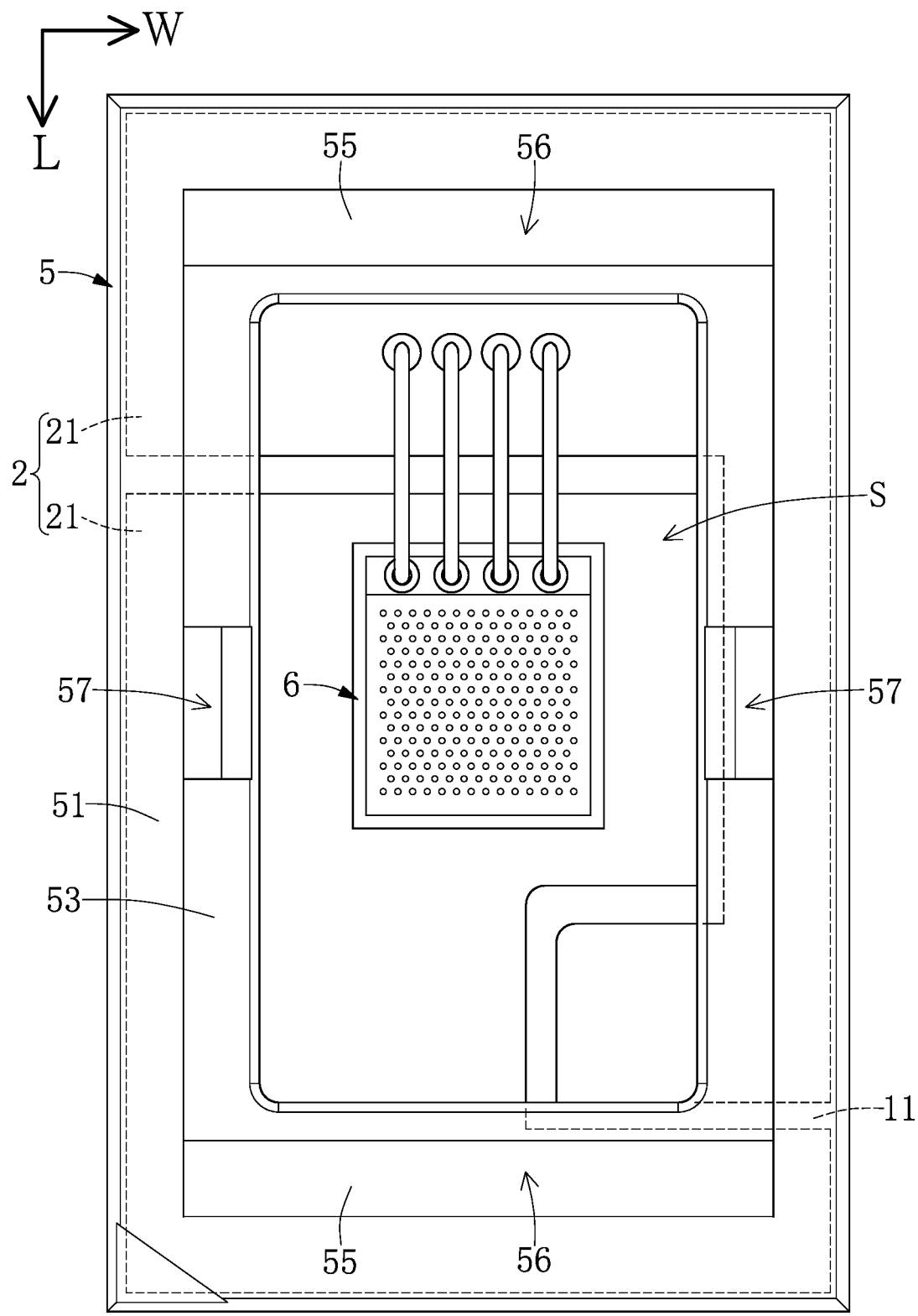
FIG. 13 is a top view of FIG. 12 with the adhesive and a light permeable member omitted.
Figure 15:
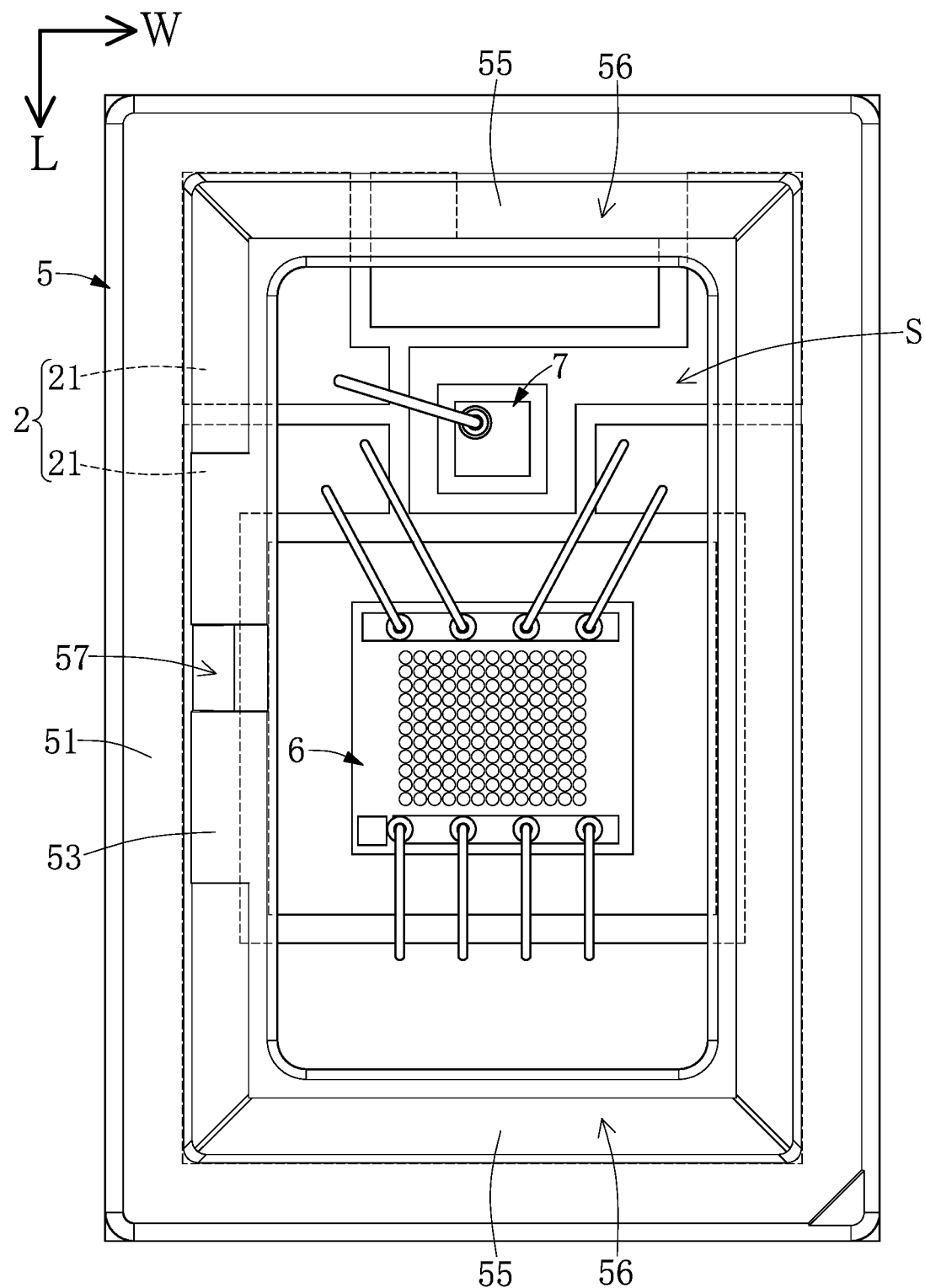
FIG. 15 is a top view of FIG. 14 with the adhesive and a light permeable member omitted.

In addition, the light source device 100 of the present embodiment is described by the above components, but the structure of the light source device 100 can be adjusted or changed according to design requirements. For example, the inside structure of the light source device 100 can be adjusted according to other embodiments shown in FIG. 8 to FIG. 15. As shown in FIG. 8 to FIG. 11, the receiving groove 56 is in a U-shape (i.e., the connection area of the slanting surface 55 and the upper tread 52 is in a U-shape), and a part of the adhesive 9 in the two receiving grooves 56 can be used to connect the light permeable member 8. As shown in FIG. 12 and FIG. 13, the light source device 100a can be formed without the light detector 7. As shown in FIG. 14 and FIG. 15, the surrounding frame 5 of the light source device 100a can include only one notch 57, the receiving groove 56 can be in a C-shape (i.e., the connection area of the slanting surface 55 and the upper tread 52 is in a C-shape), the notch 57 is arranged between two free ends of the C-shaped receiving groove 56, and a part of the adhesive 9 in the C-shaped receiving groove 56 can be used to connect the light permeable member 8.

In conclusion, since the surrounding frame 5 of the light source device 100, 100a of the present disclosure is formed with a specific structure, the accommodating space S arranged in the surrounding frame 5 can be in spatial communication with an external space through the notch 57, thereby achieving different requirements.

Moreover, the surrounding frame 5 of the light source device 100, 100a of the present disclosure can be formed with the slanting surface 55, and the slanting surface 55 is connected to the upper riser 52 and the lower tread 53 so as to form the receiving groove 56 having an angle less than 90 degrees, so that the light source device 100, 100a can use the receiving groove 56 to receive a part of the adhesive 9.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A light source device, comprising:
    a substrate including a first surface and a second surface opposite to the first surface;
    an electrode layer disposed on the first surface of the substrate;
    a surrounding frame disposed on the first surface and being formed in an annular step-like structure, wherein the surrounding frame includes:
        an upper tread arranged away from the substrate;
        an upper riser connected to an inner edge of the upper tread;
        a lower tread arranged at an inner side of the upper riser, wherein a distance between the lower tread and the first surface is less than a distance between the upper tread and the first surface; and
        a lower riser connected to an inner edge of the lower tread and arranged away from the upper tread, wherein the lower riser and the first surface jointly surround to form an accommodating space, and the surrounding frame has at least one notch recessed in the lower tread and the lower riser and being in spatial communication with the accommodating space;
    a light emitter and a light detector spaced apart from each other and mounted on the electrode layer, wherein the light emitter and the light detector are arranged in the accommodating space; and
    a light permeable member disposed on the lower tread of the surrounding frame and spaced apart from the upper riser, so that the at least one notch is formed as at least one air channel in spatial communication with the accommodating space and an external space.

2. The light source device according to claim 1, wherein the number of the at least one notch of the surrounding frame is two, and the two notches are positioned to be opposite to each other.

3. The light source device according to claim 1, wherein the at least one notch is at least formed by two inner side walls and two bottom walls, the two inner side walls are facing each other, the two bottom walls include a flat bottom wall and a slanting bottom wall, the flat bottom wall and the slanting bottom wall are arranged between the two inner walls, an edge of the slanting bottom wall is connected to the flat bottom wall so as to jointly form a slanted angle more than 90 degrees, and another edge of the slanting bottom wall is connected to the upper riser so as to jointly form a slot having an angle less than 90 degrees.

4. The light source device according to claim 3, wherein the slot formed by the slanting bottom wall and the upper riser is in a V-shape.

5. The light source device according to claim 1, wherein the surrounding frame includes at least slanting surface connected to the upper riser and the lower tread, an edge of the at least one slanting surface is connected to the lower tread so as to jointly form an angle more than 90 degrees, and another edge of the at least one slanting surface is connected to the upper riser so as to jointly form at least one receiving groove having an angle less than 90 degrees.

6. The light source device according to claim 5, further comprising an adhesive, wherein the light permeable member is fixed onto the lower tread of the surrounding frame through the adhesive, and the at least one receiving groove is configured to receive a part of the adhesive.

7. The light source device according to claim 5, wherein the number of the at least one receiving groove of the surrounding frame is two, and the two receiving grooves are positioned to be opposite to each other.

8. The light source device according to claim 7, wherein the number of the at least one notch of the surrounding frame is two, and the two notches are positioned to be opposite to each other, and the two receiving grooves and the two notches of the surrounding frame respectively correspond in position to four edges of the lower tread.

9. The light source device according to claim 5, wherein the at least one receiving groove is in a U-shape.

10. The light source device according to claim 5, wherein the number of the at least one receiving groove of the surrounding frame is only one, and the receiving groove is in a C-shape, and wherein the number of the at least one notch of the surrounding frame is only one, and the notch is arranged between two free ends of the C-shaped receiving groove.

11. The light source device according to claim 1, further comprising:
    a soldering layer disposed on the second surface of the substrate; and
    a plurality of conductive posts embedded in the substrate and electrically connecting the electrode layer to the soldering layer.

12. The light source device according to claim 1, wherein a protruding part of the light permeable member protrudes from the upper tread, and a volume of the protruding part of the light permeable member is more than 50% of a total volume of the light permeable member.

13. The light source device according to claim 1, wherein a top surface of the light permeable member is substantially coplanar with the upper thread of the surrounding frame.

14. The light source device according to claim 1, wherein the light emitter is a Vertical-Cavity Surface-Emitting Laser (VCSEL) for providing an infrared light, and the light detector is a photodiode (PD) for monitoring a light signal emitted from the light emitter.

15. The light source device according to claim 1, wherein the light permeable member includes a transparent glass board and a light-diffusion polymer layer formed on the transparent glass board.

16. A light source device, comprising:
a substrate including a first surface and a second surface opposite to the first surface;
an electrode layer disposed on the first surface of the substrate;
a surrounding frame disposed on the first surface and being formed in an annular step-like structure, wherein the surrounding frame includes:
an upper tread arranged away from the substrate;
an upper riser connected to an inner edge of the upper tread;
a lower tread arranged at an inner side of the upper riser, wherein a distance between the lower tread and the first surface is less than a distance between the upper tread and the first surface; and
a lower riser connected to an inner edge of the lower tread and arranged away from the upper tread, wherein the lower riser and the first surface jointly surround to form an accommodating space, and the surrounding frame has at least one notch recessed in the lower tread and the lower riser and being in spatial communication with the accommodating space;
a light emitter mounted on the electrode layer and arranged in the accommodating space; and
a light permeable member disposed on the lower tread of the surrounding frame and spaced apart from the upper riser, so that the at least one notch is formed as at least one air channel in spatial communication with the accommodating space and an external space.

17. A depth camera module, comprising a light source device as claimed in claim 16.

* * * * *